(12) United States Patent
Lin et al.

(10) Patent No.: US 6,349,031 B1
(45) Date of Patent: Feb. 19, 2002

(54) COOLING STORAGE DEVICE AND COOLING MODULE

(75) Inventors: Bo-Yao Lin; I-Huei Huang; Lin-Hsiu Chiang, all of Taipei; Tsung-I Chang, Xinzhu; Sho-Chang Sun, Taipei, all of (TW)

(73) Assignee: Acer, Inc. (TW)

( * ) Notice: Subject to any disclaimer, the term of this patent is extended or adjusted under 35 U.S.C. 154(b) by 0 days.

(21) Appl. No.: 09/650,171

(22) Filed: Aug. 29, 2000

(30) Foreign Application Priority Data

May 30, 2000 (TW) ......................................... 089110430

(51) Int. Cl.$^7$ ................................................. H05K 5/00

(52) U.S. Cl. ....................... 361/685; 361/754; 361/707; 312/223.2

(58) Field of Search ............................... 361/685–686, 361/684, 683, 724–727, 732, 740, 754, 694, 695, 697, 717–719, 704, 707, 797; 312/223.1–223.2; 439/152–153, 157, 928.1

(56) References Cited

U.S. PATENT DOCUMENTS

| | | | | |
|---|---|---|---|---|
| 5,818,696 A | * | 10/1998 | Knoop | 361/730 |
| 6,185,097 B1 | * | 2/2001 | Behl | 361/695 |
| 6,193,339 B1 | * | 2/2001 | Behl et al. | 312/223.2 |

* cited by examiner

*Primary Examiner*—Leo P. Picard
*Assistant Examiner*—Hung Van Duong
(74) *Attorney, Agent, or Firm*—Knobbe, Martens, Olson & Bear, LLP

(57) ABSTRACT

A storage box for hard disk drive (HDD) is provided. The storage box includes an outer frame, a first holder, a second holder, a cooling module and a back panel board. The first and second holders are opposite and for supporting the HDD. The cooling module, for cooling the HDD, is fixed in the storage box via the second holder and the outer frame. The cooling air is drawn into the storage box by the cooling module. The back panel board is electrically connected to the cooling module. The back panel board has an outlet positioned relative to the cooling module. The cooling air is flowed through surface of the HDD and a heat sink of the cooling module, and then exhausted from the outlet of the back panel board.

11 Claims, 7 Drawing Sheets

COOLING STORAGE DEVICE AND COOLING MODULE

REFERENCE TO RELATED APPLICATION

The present application claims priority of Taiwan application serial No. 089110430, filed on May 30, 2000, and the contents thereof are herein incorporated as reference.

BACKGROUND OF THE INVENTION

1. Field of the Invention

The invention relates to a cooling storage device for hard disk drive (HDD), and more particularly relates to a HDD cooling storage device with cooling modules.

2. Background of the Invention

As data communication and data sharing are more and more popular, and people have more requirements on local area network (LAN) and world wide web (WWW), a server, for example, a file server, a printer server and so on, plays a very important role. A server must have enough storage capacity for user's demand. Therefore, there are some storage devices, for example hard disk drive (HDD), in a server. Recently, due to the rapid improvement on computer technology, the capacity and operation speed of HDD is enhanced also. Accompanied with the enhancement on capacity and operation speed, power consumption of HDD is increased rapidly, and so is the temperature of HDD. The operation of the server will be negatively effected by an over-heated HDD. It is an important issue on cooling HDD.

HDD is usually stored in the server by a HDD storage box. Referring to FIG. 1, which schematically shows a general server comprising a HDD storage box 101. Then, referring to FIG. 2, which schematically shows the HDD storage box 101. The HDD storage box 101 includes an outer frame 201 and a cooling blower module 203. Some HDDs 205 are inserted into and fixed in the HDD storage box 101. As shown in FIG. 2, HDDs 205 are densely arranged in the HDD storage box 101, i.e., there is little space between two adjacent HDDs 205. As known, heat is generated during the operation of HDD, and large amount of heat will seriously affect normal operation of system and even cause damage to HDD and data stored therein.

In conventional cooling practice, a cooling blower 203 is added in back panel of HDD storage box 101. The operation of the-cooling blower 203 makes some cooling air flow into the HDD storage box from front panel of HDD storage box 101. Via flowing of cooling air, heat generated by HDD 205 is brought out of the HDD storage box 101 through the back panel thereof. Thus, HDD is cooled.

Now referring to FIG. 3, which shows a back panel board of the HDD storage box shown in FIG. 2. The back panel board 301, electrically connected to HDD, is located between the outer frame 201 and the blower 203. For a better cooling effect, there are some outlets 303 on the back panel 301. The cooling air flows through spaces between HDDS via the outlets 303.

However, the conventional cooling issue has some disadvantages as follows.

1. The cooling blower is disposed on the back panel of the HDD storage box, and hence, the whole volume of the HDD storage box is large. The space design for the server is more complicated to designers.

2. Because there is only one cooling blower in the server, when the only blower is out of order, the HDD storage box cannot be cooled by the blower. If so, the server must be shut down immediately for preventing the HDD from being over-heated, damaged and unstable.

3. As shown in FIG. 3, there are some outlets 303 on the back panel board for a better cooling efficiency. In addition, there are some circuit layouts on the back panel board for electrically connecting the back panel board to HDD. So, the more outlets on the back panel board, the more restrictions are on circuit layouts. That is, the circuit layouts are limited by position of outlets. This may cause a high flow resistance and a low cooling efficiency. The circuit layouts are influenced, and so is the operation speed of HDD.

SUMMARY OF THE INVENTION

Therefore, the invention provides a HDD storage box with several cooling modules for cooling HDD. The HDD storage box is inserted in a server device, for example a file server. The cooling modules are hot-plug. That is, if one of the cooling modules is out of order, users or maintenance personnel do not have to shut down the server device for maintenance or exchange the out-of-ordered cooling module.

In order to achieve the above objective, the invention provides a storage box for hard disk drive (HDD). The storage box includes an outer frame, a first holder, a second holder, a cooling module and a back panel board. The first and second holders are opposite and for fixing A the HDD. The cooling module, for cooling the HDD, is fixed in the storage box via the second holder and the outer frame. The cooling air is drawn into the storage box by the cooling module. The back panel board is electrically connected to the cooling module. The back panel board has an outlet whose position is related to the cooling module. The cooling air flows through surface of the HDD and a heat sink of the cooling module, and then exhausts from the outlet of the back panel board.

BRIEF DESCRIPTION OF THE DRAWINGS

The invention is best understood by reference to the detailed description, which follows in conjunction with the accompanying drawings.

DESCRIPTION OF THE INVENTION

Figure 1:
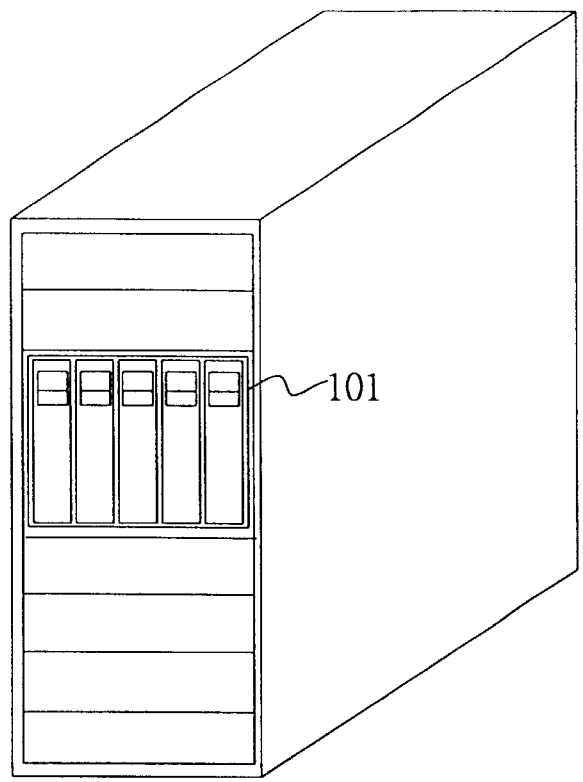
FIG. 1 illustrates a general server having a conventional HDD storage box.
Figure 2:
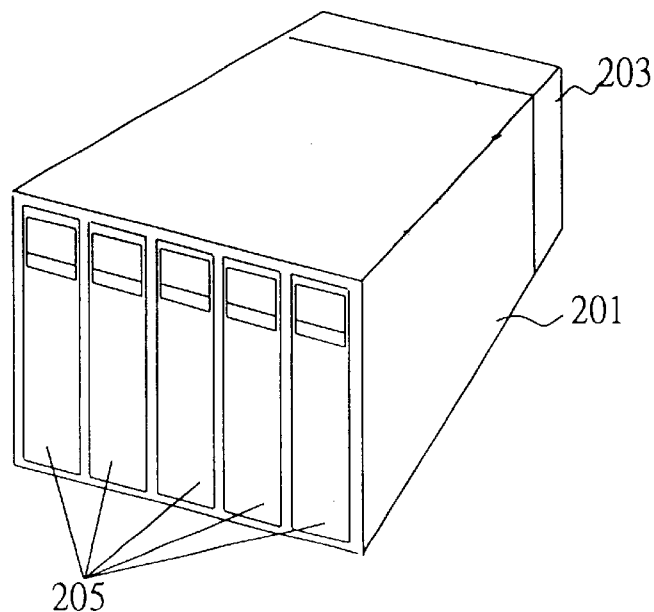
FIG. 2 shows a perspective view of a conventional HDD storage box of FIG. 1.
Figure 3:
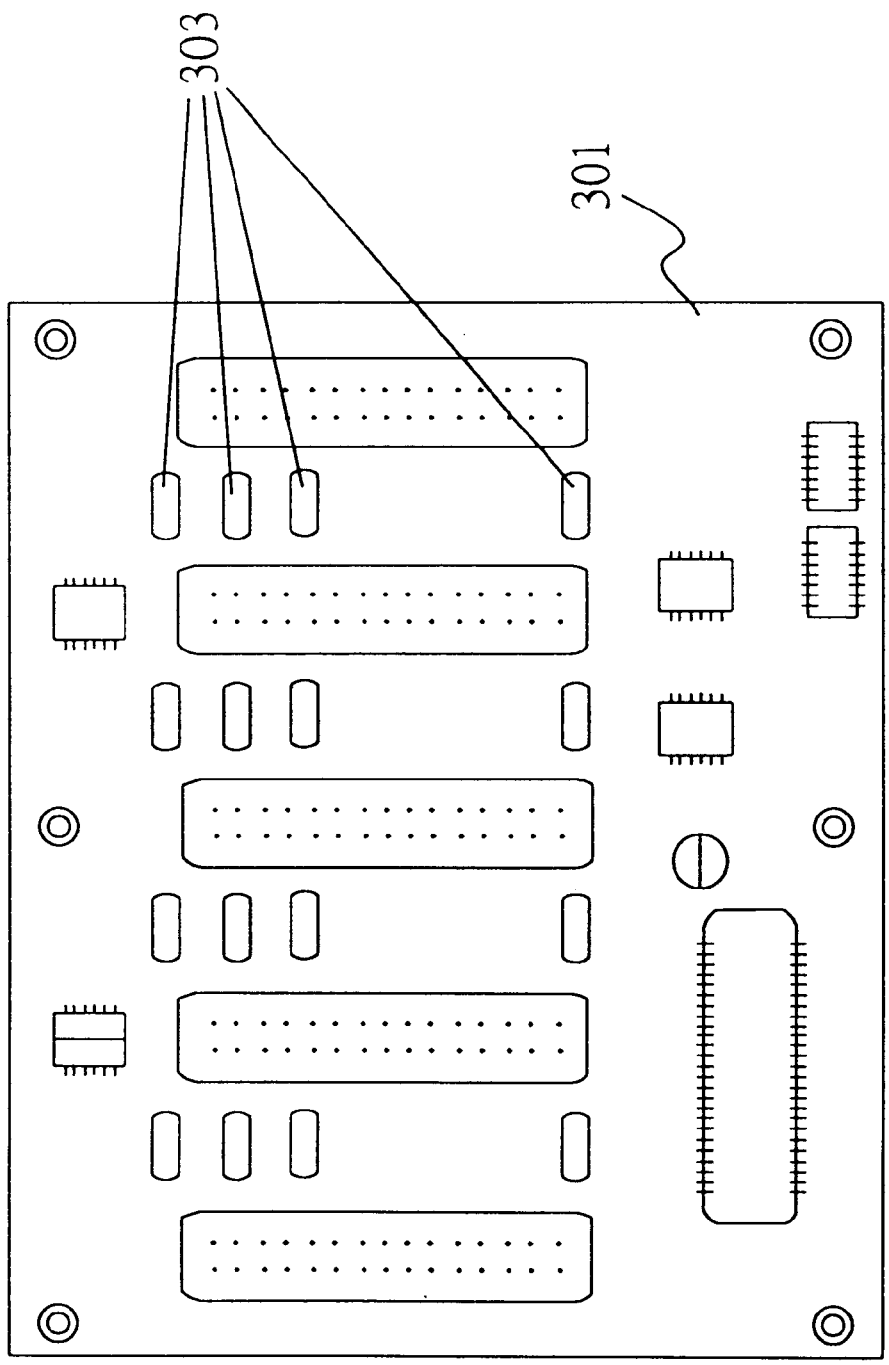
FIG. 3 shows a back panel board of the conventional HDD storage box of FIG. 2.
Figure 4:
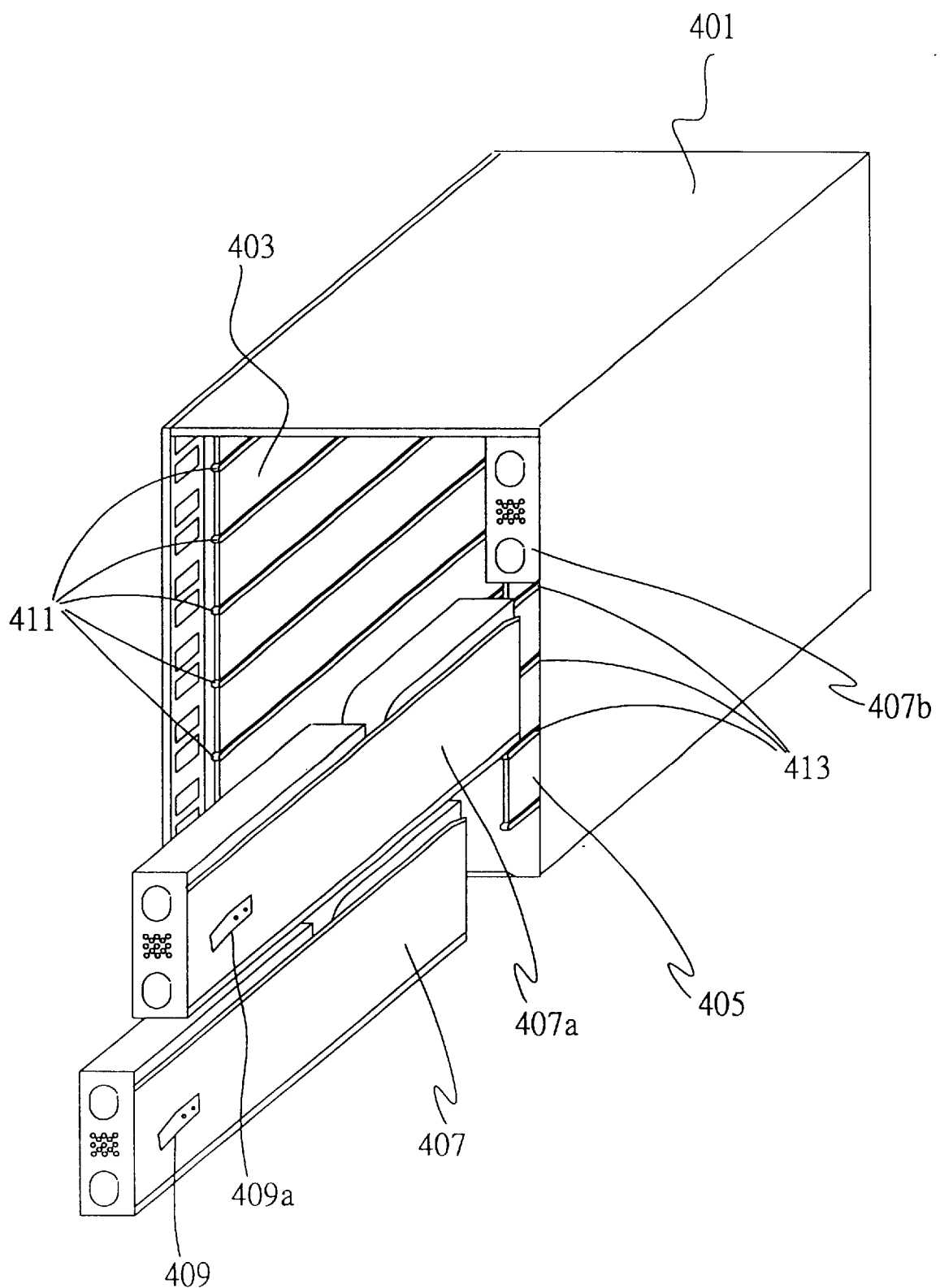
FIG. 4 shows a perspective view of a HDD storage box according to one preferred embodiment of the invention, wherein the cooling modules are installing into the HDD storage box.

FIG. 4 shows a perspective view of a HDD storage box according to one preferred embodiment of the invention, wherein the cooling modules are installed into the HDD storage box. The HDD storage box includes: an outer frame 401, a first holder 403, a second holder 405 and a number of cooling modules 407, 407a and 407b. In this embodiment, there are three cooling modules used in the storage box. Of course, the invention is not limited by using three cooling modules in the storage box.

The holders 403 and 405 are placed inside the outer frame 401 for supporting HDD (not shown) inserted into the HDD storage box. The two holders 403 and 405 respectively attach tightly to each side of the HDD. In the embodiment, the first holder 403 is positioned at the internal side of the outer frame 401, and the second holder 405 is positioned at the corresponding opposite side. The position relation between the first holder 403 and the second holder 405 is called 'opposite position'. The two holders 403 and 405 have respective raid rods 411 and 413 for guiding HDD into the storage box to a predetermined position. These two holders 403 and 405 are preferably made of well heat-conducting material, for example, Aluminum (Al) for better heat conduction. Part of the heat generated by HDD is conducted to the holders 403 and 405, and then to the outer frame 401 and cooling modules.

The cooling modules 407, 407a and 407b are installed between the outer frame 401 and the second holder 405 and tightly contact them. The cooling modules have respective spring pieces 409, 409a and 409b. Taking the cooling module 407 for example, the spring piece 409 is located at one side having the contact with the outer frame 401. When the cooling module 407 is to be inserted into the storage box, the spring piece 409 contacts with the outer frame 401, and hence, an elastic force is generated due to deformation of the spring piece 409. This elastic force causes the cooling module 407 to have a tighter contact with the second holder 405. Hence, the heat-conducting efficiency between the cooling module 407 and the second holder 405 is enhanced. Other spring pieces 409a and 409b have the same function and structure as the spring piece 409. Therefore, part of the heat generated by HDD is conducted to the cooling modules 407, 407a and 407b via the second holder 405 for better cooling efficiency. The adjacent cooling modules densely contact with each other.

Figure 5:
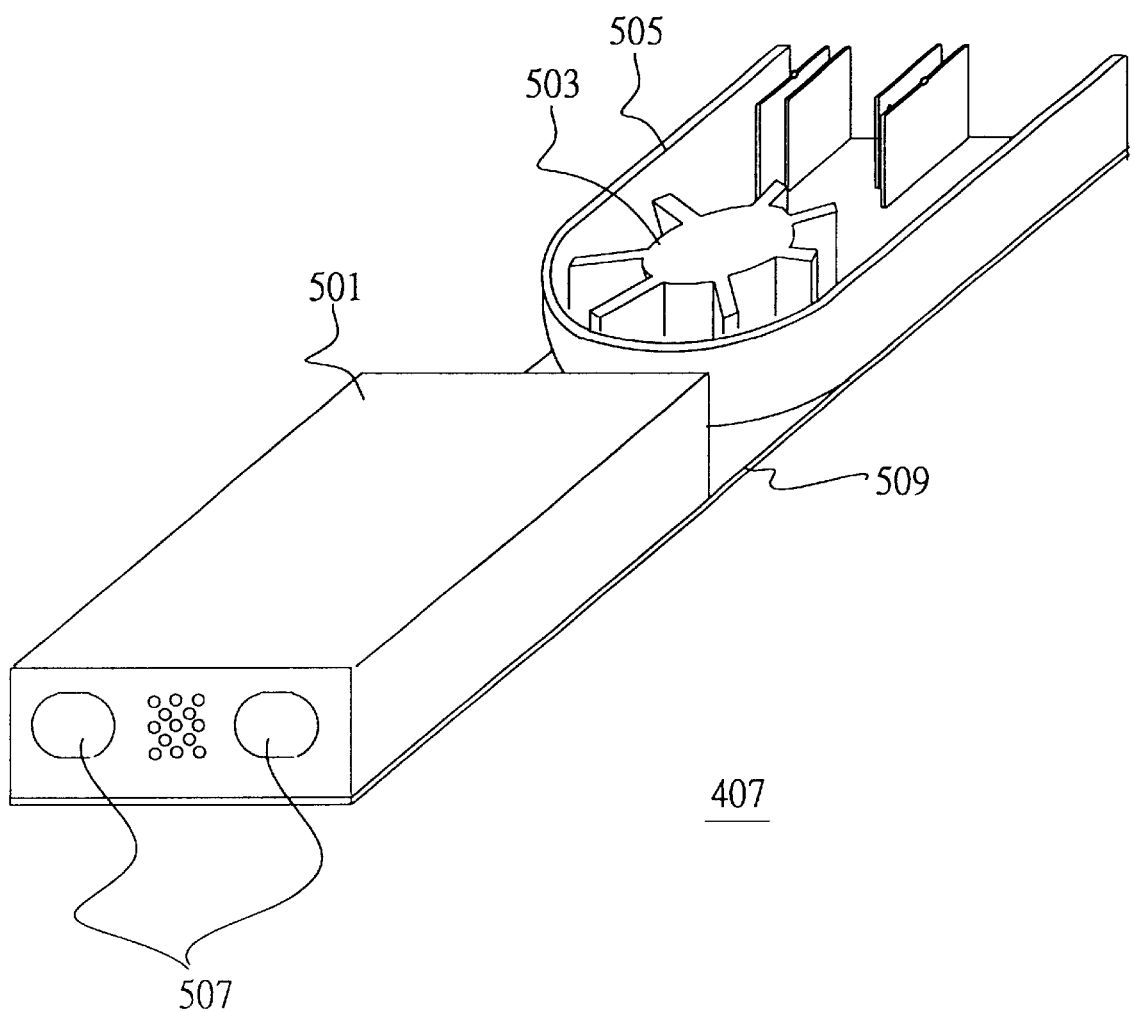
FIG.5 shows a perspective view of a cooling module in the HDD storage box shown in FIG. 4.

Now referring to FIG. 5, which shows a perspective view of the cooling module according to the embodiment of the invention. The cooling module 407 includes: a heat sink 501, a heat sink base 509, a blower 503 and a blower housing 505 related to the blower 503. The heat sink 501 is located on the heat sink base 509.

When the cooling module 407 is inserted into the storage box, the heat sink 501 contacts with the second holder 405, and the heat sink base 509 contacts with the outer frame 401. The blower 503 is located in the rear of the heat sink base 509. The blower housing 505 is located between the heat sink 501 and the blower 503. There are outlets 507 at the front panel of the heat sink 501. When the blower is in use, cooling air is drawn into the heat sink 501 through the outlets 507. There is enough distance between the heat sink 501 and the blower 503 for better cooling efficiency.

Figure 6:
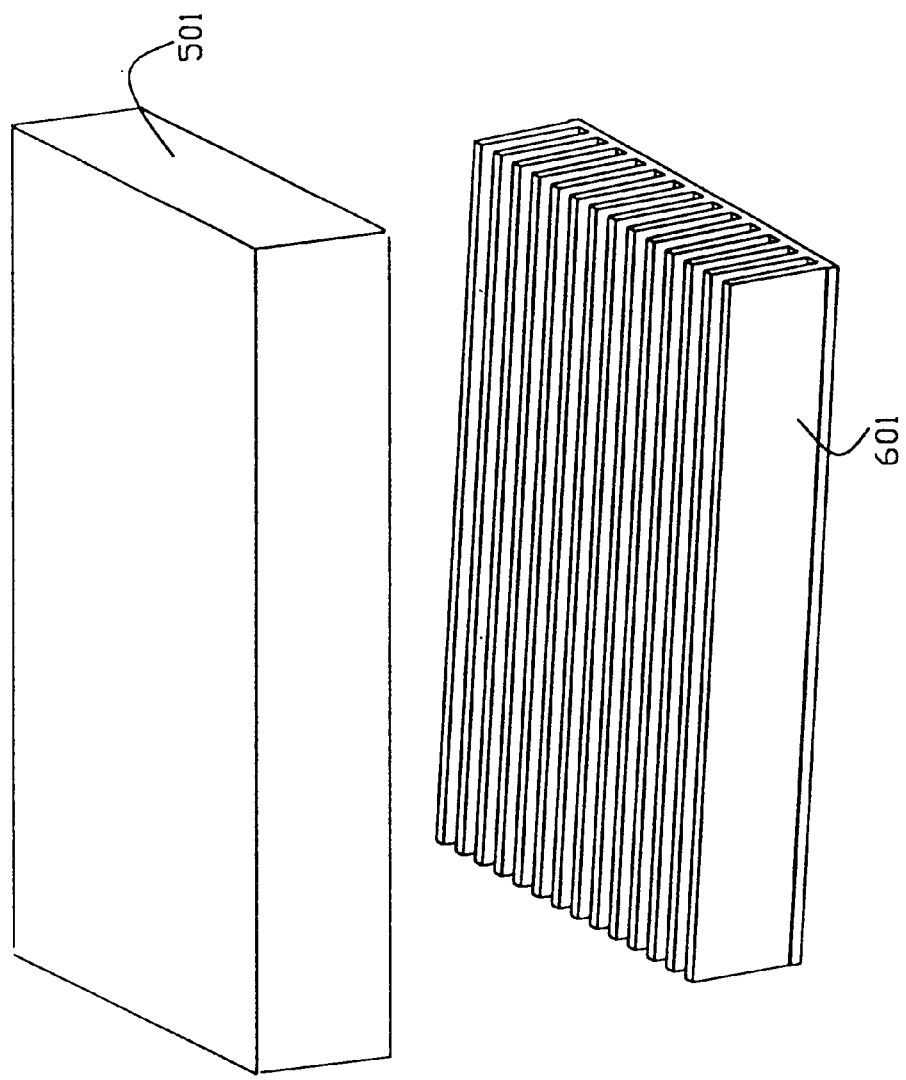
FIG. 6 shows a rear view of a heat sink of the cooling module shown in FIG. 5.

Now referring to FIG. 6, showing the heat sink 501 of FIG. 5. As shown in FIG. 6, there is a heat fin 601 inside the heat sink 501. When the blower 503 is in operation, the outside air flows into the heat sink 501 and then into the heat fin 601. As stated above, part of heat generated by HDD is conducted from the second holder 405, the heat sink 501 and then to the heat fin 601. The heat conducted to the heat fin 601 is exhausted out of the storage box via cooling air. In addition, for better flow direction and cooling efficiency, the blower housing 505 is lower than the heat sink 501.

Figure 7:
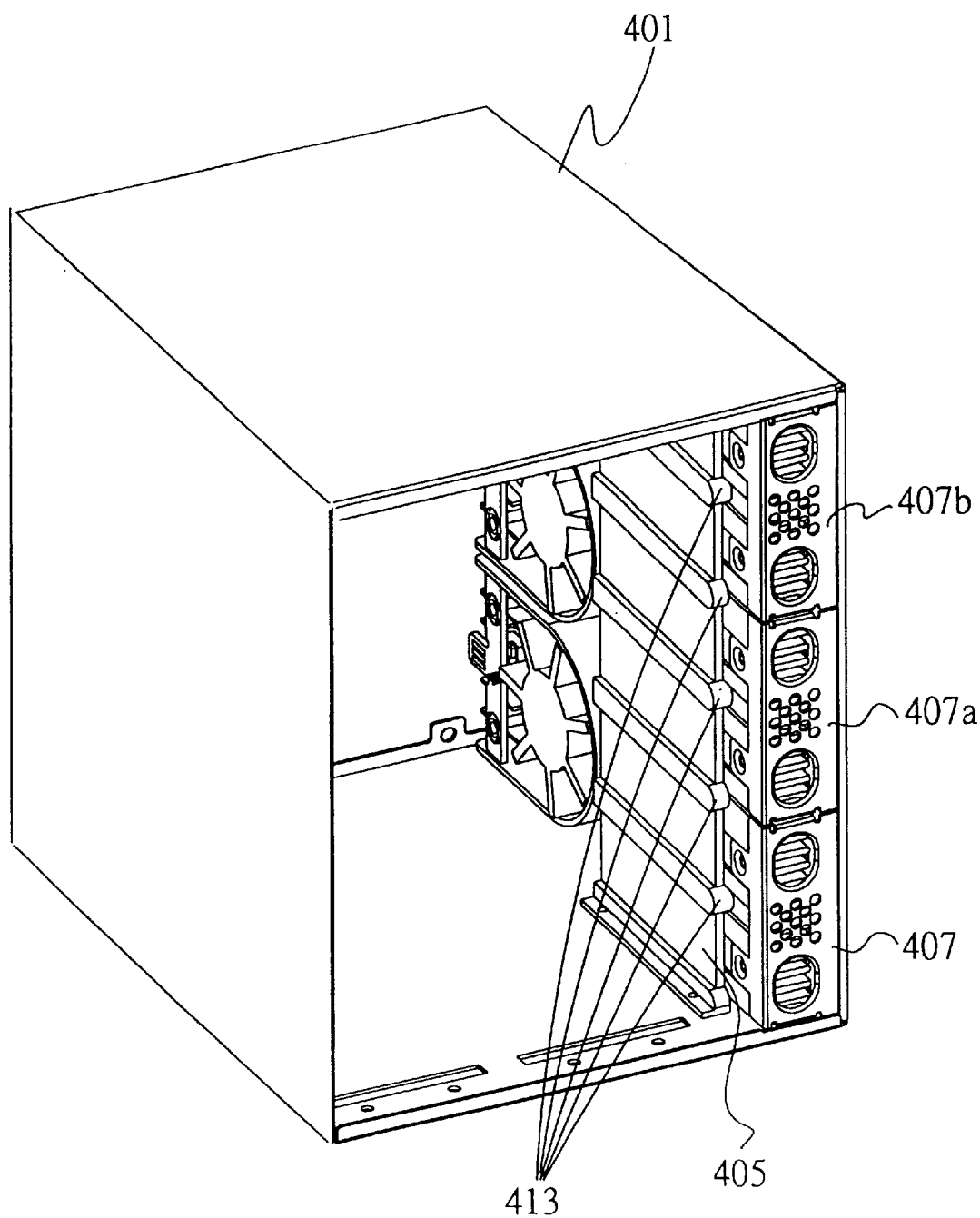
FIG. 7 shows a perspective view of a HDD storage box according to the preferred embodiment of the invention, wherein the cooling modules have been installed into the HDD storage box.

Now referring to FIG. 7, which shows a perspective view of a HDD storage box according to the preferred embodiment of the invention, wherein the cooling modules have been installed into the HDD storage box. The cooling modules 407, 407a and 407b tightly contact with the second holder 405. So, the heat generated by HDD is conducted to the second holder 405, and then to the heat sink 501. The design for the length of the second holder 405 is for supporting the HDD, tightly contacting with the cooling modules and un-overlapping the blower.

The cooling modules are designed for redundancy. If one blower or one of the cooling modules is out of order, the invention can reduce the negative effect caused by the out-of-ordered one. Part of the heat generated by HDD related to the out-of-ordered cooling module is indirectly conducted to another adjacent cooling module.

The cooling modules are hot-plug. If one cooling module is out of order or needs to be maintained, the server does not need to be shut down for maintenance. User can directly take out the out-of-ordered cooling module for maintenance or replacement. The hot-plug function is achieved by proper electrical connection between the back panel and the cooling modules.

Because there are two holders to support HDD, HDD is not shaken when user or workman is maintaining the cooling module. This prevents the server from being unstable or having data loss in HDD.

Figure 8:
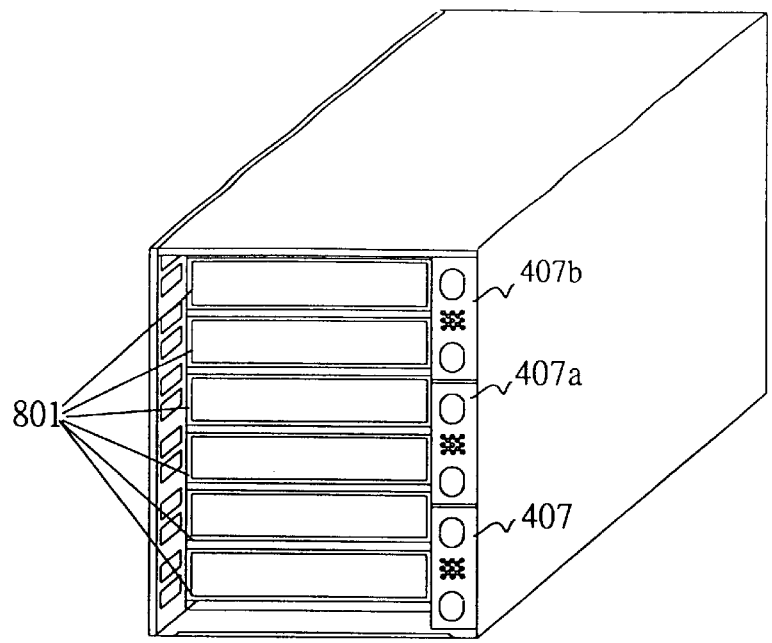
FIG. 8 shows a perspective view of a HDD storage box into which HDD is inserted.

Now referring to FIG. 8, which shows a perspective view of a HDD storage box into which HDD is inserted. After HDD is in operation, the temperature thereof is increased. There are two cooling ways, convection and conduction, performed by the cooling modules on HDD.

In the first way, convection, when the blower is in operation, cooling air is drawn into the cooling storage box from outlets of the front panel. The cooling air flows through spaces between adjacent HDDs for taking part of the heat generated by HDD from its surface, and hence the temperature of HDD is down.

In the second way, conduction, part of the heat generated by the HDD is conducted to the second holder 405, and then to the heat sink of the cooling module. The cooling air, taken by the blower, also flows into the heat sink for taking heat generated from the HDD.

Figure 9:
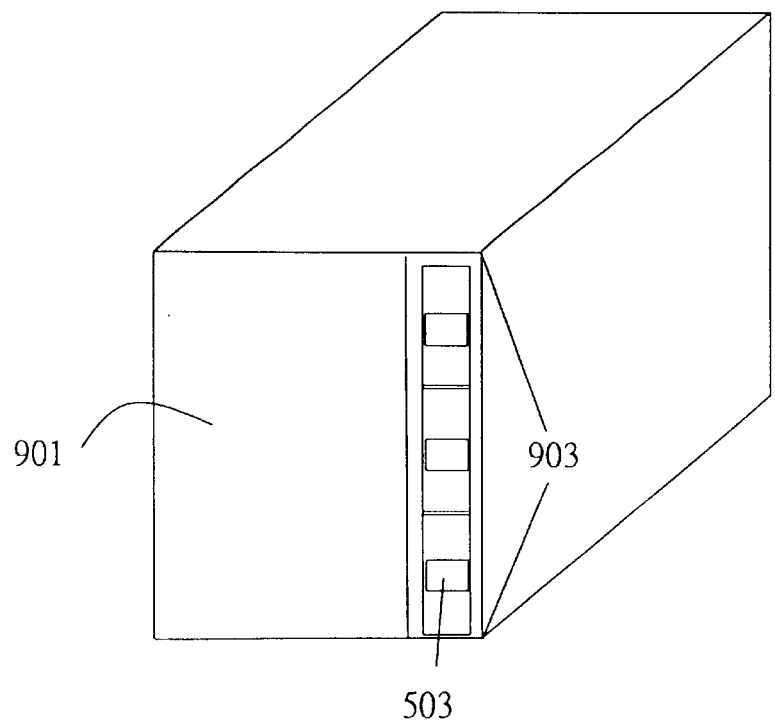
FIG. 9 is a rear view of the HDD storage according to the preferred embodiment of the invention.

FIG. 9 is a rear view of the HDD storage box according to the preferred embodiment of the invention. The HDD storage box further includes a back panel board 901 located on its back panel. There is a circuitry on the back panel board 901 for electrically connecting the HDD with the blower. The outlet 903 of the back panel board 901 is positioned relative to the position of the blower for exhausting the cooling air flowed through the HDD surface and the heat sink. The width of the outlet 903 is related to that of the blower for facilitating exhaust of cooling air.

The invention is not limited by using three cooling modules. Besides, the blower used in the invention may be axial-flow blower, centrifugal blower or the like.

The advantages of the invention are as follows.

1. Compared with the length of the conventional HDD storage box, 215 mm, the length of the HDD storage box in the invention is reduced to 188 mm. The reduced length results from placing the cooling module on the sides of the storage box, rather than at back of the storage box in the conventional art. Therefore, space taken by the HDD storage box is reduced, and there are more margins on designing other inner space of the server.

2. Because there are several cooling modules in the storage box of the server, and the cooling modules are hot-plug, a maintenance man does not have to shut down the server for replacing or maintaining an out-of-ordered cooling module. The cooling module is independently operated with each other. Other cooling module, except the out-of-ordered one, still operates normally. The stability of the server is enhanced, and the convenience for maintenance is also enhanced.

3. There is only one outlet on the back panel board of the HDD storage box. Hence, there is no flow resistance on the back panel board and circuit layout thereon is easier.

4. There are two independent cooling ways in the HDD storage box. Compared with the conventional art, the efficiency for cooling the HDD is enhanced.

While the invention has been described in detail with reference to certain preferred embodiments, it should be appreciated that the invention is not limited to those precise embodiments. Rather, in view of the present disclosure that describes the current best mode for practicing the invention, many modifications and variations would present themselves to those of skill in the art without departing from the scope and spirit of the invention. The scope of the invention is, therefore, indicated by the following claims rather than by the foregoing description. All changes, modifications and variations coming within the meaning and range of equivalency of the claims are to be considered with in their scope.

What is claimed is:

1. A storage box for a hard disk drive (HDD), comprising:
   an outer frame;
   a first holder and a second holder opposite to the first holder, for fixing the HDD contacted with one side of the second holder;
   a cooling module, fixed in the storage box via the other side of the second holder, the cooling module drawing cooling air into the storage box; and
   a back panel board, electrically connected to the cooling module, having an outlet for exhausting cooling air, the position of the outlet related to that of the cooling module;
   wherein cooling air flows through the HDD and the cooling module, and is exhausted from the outlet of the back panel board.

2. The storage box of claim 1, wherein the cooling module comprises:
   a heat sink base;
   a heat sink, located on the heat sink base, contacting with the second holder, part of heat generated by the HDD conducted to the heat sink; and
   a blower, located on the heat sink base and opposite to the heat sink, electrically connected to the back panel board.

3. The storage box of claim 1, wherein the heat sink further comprises an outlet through which the cooling air passes.

4. The storage box of claim 1, wherein the cooling module comprises a blower frame between the heat sink and the blower, the blower frame being lower than the heat sink.

5. The storage box of claim 1, wherein the cooling module further comprises a spring element making the cooling module tightly contact with the outer frame.

6. The storage box of claim 1, wherein the first holder and the second holder respectively have rail rods for guiding-the HDD into the storage box.

7. A cooling module for cooling a hard disk drive (HDD) in a HDD storage box having an outer frame, a first holder, a second holder opposite to the first holder and a back panel board having a outlet, the cooling module comprising:
   a heat sink base;
   a heat sink, on the heat sink base, contacting with the second holder, part of heat generated by the HDD conducted to the heat sink; and
   a blower, on the heat sink base, electrically connected to the back panel board, for drawing cooling air into the HDD storage box, the cooling box flowing through surface of the HDD and the heat sink, and exhausting out of the HDD storage box from the outlet of the back panel board.

8. The cooling module of claim 7, wherein the heat sink further comprises an outlet through which cooling air pass.

9. The cooling module of claim 7, further comprising a blower frame between the heat sink and the blower, the blower frame being lower than the heat sink.

10. The cooling module of claim 7, further comprising a spring element making the cooling module tightly contact with the outer frame.

11. A storage box for storing a hard disk drive (HDD), comprising:
    an outer frame;
    a first holder, locating at one side in the outer frame;
    a second holder, opposite to the first holder, the first and second holders for fixing the HDD; and
    a plurality of cooling modules, between the second holder and the outer frame, for cooling the HDD, each cooling module comprising:
    a heat sink base;
    a heat sink, on the heat sink base, contacting with the second holder; and
    a blower, on the heat sink and opposite to the heat sink.

* * * * *